(12) United States Patent
Minegishi

(10) Patent No.: US 11,211,322 B2
(45) Date of Patent: Dec. 28, 2021

(54) PRINTED CIRCUIT BOARD AND ELECTRONIC EQUIPMENT

(71) Applicant: CANON KABUSHIKI KAISHA, Tokyo (JP)

(72) Inventor: Kunihiko Minegishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/522,422

(22) Filed: Jul. 25, 2019

(65) Prior Publication Data

US 2019/0348359 A1 Nov. 14, 2019

Related U.S. Application Data

(63) Continuation of application No. 15/918,210, filed on Mar. 12, 2018, now Pat. No. 10,403,571, which is a
(Continued)

(30) Foreign Application Priority Data

Oct. 29, 2014 (JP) .................................. 2014-220664

(51) Int. Cl.
*H01L 23/49* (2006.01)
*H01L 23/498* (2006.01)
(Continued)

(52) U.S. Cl.
CPC .. *H01L 23/49894* (2013.01); *H01L 27/14618* (2013.01); *H01L 27/14636* (2013.01);
(Continued)

(58) Field of Classification Search
CPC ... H01L 2224/16227; H01L 2225/1023; H01L 2225/1058; H01L 23/13; H01L 23/49816; H01L 23/49838; H01L 23/49894; H01L 25/105; H01L 25/50; H01L 27/14618; H01L 27/14636; H01L 2924/15156; H01L 2924/15159; H01L 2924/15311;
(Continued)

(56) References Cited

U.S. PATENT DOCUMENTS 5,473,814 A * 12/1995 White .................. H01L 21/563
29/840
5,592,562 A * 1/1997 Rooks .................. G01N 23/044
382/150
(Continued)

*Primary Examiner* — Mohammed Shamsuzzaman
(74) *Attorney, Agent, or Firm* — Canon U.S.A., Inc., IP Division

(57) ABSTRACT

A plurality of lands is formed apart from each other on a surface of a package substrate. Another plurality of lands is formed apart from each other on a surface of a printed wiring board. The surface of the package substrate and the surface of the printed wiring board face each other. The plurality of lands and another plurality of lands are bonded to each other with solder having a height of 30% or less of a diameter of a solder bonding portion at the corresponding land. A ratio of a solder bonded area of at least each of lands, among another plurality of the lands, of which distance value to a corresponding one of the lands is larger than an average distance value between the lands and another lands, to a solder bonded area of the corresponding one of the lands is 56% or more and 81% or less.

16 Claims, 8 Drawing Sheets

Related U.S. Application Data continuation of application No. 14/924,473, filed on Oct. 27, 2015, now Pat. No. 9,960,109.

(51) Int. Cl.
| | |
|---|---|
| *H01L 27/146* | (2006.01) |
| *H01L 23/14* | (2006.01) |
| *H01L 23/13* | (2006.01) |
| *H01L 25/10* | (2006.01) |
| *H01L 25/00* | (2006.01) |

(52) U.S. Cl.
CPC ........ *H01L 23/13* (2013.01); *H01L 23/49816* (2013.01); *H01L 23/49838* (2013.01); *H01L 25/105* (2013.01); *H01L 25/50* (2013.01); *H01L 2224/16227* (2013.01); *H01L 2225/1023* (2013.01); *H01L 2225/1058* (2013.01); *H01L 2924/15156* (2013.01); *H01L 2924/15159* (2013.01); *H01L 2924/15311* (2013.01); *H01L 2924/15787* (2013.01); *H01L 2924/16195* (2013.01); *H01L 2924/19105* (2013.01); *H01L 2924/3511* (2013.01)

(58) Field of Classification Search
CPC . H01L 2924/15787; H01L 2924/16195; H01L 2924/19105; H01L 2924/3511
See application file for complete search history.

(56) References Cited

U.S. PATENT DOCUMENTS

| | | | | |
|---|---|---|---|---|
| 6,169,328 B1* | 1/2001 | Mitchell | ................. | H01L 21/56 257/675 |
| 6,199,741 B1* | 3/2001 | Garrity | ................. | G01R 31/71 228/103 |
| 6,353,191 B1* | 3/2002 | Harper, Jr. | ........... | H05K 3/3426 174/267 |
| 6,630,661 B1* | 10/2003 | Hoffman | ........... | H01L 27/14618 250/216 |
| 6,660,944 B1* | 12/2003 | Murata | ................ | H05K 3/3457 174/261 |
| 7,161,239 B2* | 1/2007 | Zhao | ........................ | H01L 23/36 257/707 |
| 7,906,733 B2* | 3/2011 | Kumakura | ............ | H01L 25/105 174/261 |
| 9,053,990 B2* | 6/2015 | Chuang | .................... | H01L 24/13 |
| 9,084,386 B2* | 7/2015 | Wada | ..................... | H05K 13/08 |
| 9,406,600 B2* | 8/2016 | Kudo | ................ | H01L 23/49838 |
| 2001/0010323 A1* | 8/2001 | Dautartas | ............. | B23K 1/0016 228/254 |
| 2001/0029118 A1* | 10/2001 | Ota | ........................ | H05K 3/363 439/65 |
| 2002/0003160 A1* | 1/2002 | Beroz | .................... | H01L 24/73 228/180.1 |
| 2005/0221538 A1* | 10/2005 | Suzuki | ................. | H01L 23/488 438/126 |
| 2005/0241690 A1* | 11/2005 | Tajima | .................... | H01L 35/08 136/212 |
| 2007/0096327 A1* | 5/2007 | Kawamura | ....... | H01L 23/49816 257/774 |
| 2007/0132090 A1* | 6/2007 | Kuwabara | ............ | H05K 3/3436 257/700 |
| 2008/0150101 A1* | 6/2008 | White | .................. | H01L 23/4985 257/668 |
| 2008/0182398 A1* | 7/2008 | Carpenter | ............... | H01L 24/49 438/612 |
| 2009/0230546 A1* | 9/2009 | Komatsu | ............ | H01L 25/0652 257/737 |
| 2010/0123162 A1* | 5/2010 | Kondo | ..................... | H01L 33/62 257/99 |
| 2011/0163430 A1* | 7/2011 | Lee | ................... | H01L 23/49582 257/676 |
| 2012/0098130 A1* | 4/2012 | Yip | .................. | H01L 23/49866 257/738 |
| 2012/0305305 A1* | 12/2012 | Upadhyayula | .... | H01L 23/49838 174/261 |
| 2012/0305631 A1* | 12/2012 | Feger | ...................... | H01L 24/11 228/176 |
| 2013/0119541 A1* | 5/2013 | Ikeda | .................... | H05K 1/0271 257/738 |
| 2013/0143361 A1* | 6/2013 | Lin | ......................... | H01L 24/81 438/110 |
| 2013/0313007 A1* | 11/2013 | Tolpin | .................... | H05K 1/111 174/260 |
| 2014/0117532 A1* | 5/2014 | Chuang | .................... | H01L 24/13 257/737 |
| 2014/0117554 A1* | 5/2014 | Uehling | ............ | H01L 23/49838 257/773 |
| 2014/0252598 A1* | 9/2014 | Yu | ........................... | H01L 24/11 257/737 |
| 2014/0376202 A1* | 12/2014 | Shibutani | ............. | H05K 3/3436 361/767 |

* cited by examiner

PRINTED CIRCUIT BOARD AND ELECTRONIC EQUIPMENT

CROSS REFERENCE TO RELATED APPLICATIONS

The present application is a continuation of U.S. patent application Ser. No. 15/918,210, filed on Mar. 12, 2018, which is a continuation of U.S. patent application Ser. No. 14/924,473, filed on Oct. 27, 2015 and issued as U.S. Pat. No. 9,960,109 on May 1, 2018, which claims priority from Japanese Patent Application No. 2014-220664, filed Oct. 29, 2014, all of which are hereby incorporated by reference herein in their entirety.

BACKGROUND OF THE INVENTION

Field of the Invention

The present invention relates to a printed circuit board in which a land of a semiconductor package and a land of a printed wiring board are bonded to each other by solder, and to electronic equipment including the printed circuit board.

Description of the Related Art

Due to recent improvement of performance of a semiconductor element mounted in electronic equipment, high pin count is required to be achieved with lands (electrodes) of a semiconductor package on which the semiconductor element is mounted to realize a stable and high-speed operation of the semiconductor element. Furthermore, to satisfy demands for smaller and thinner mobile devices, digital cameras and the like, the lands are required to be arranged at a finer pitch to achieve the high pin count with a smaller semiconductor package.

Ball Grid Array (BGA) and Land Grid Array (LGA), with which the lands can be densely arranged in a grid form on a lower surface of the package substrate, are employed to realize a semiconductor package achieving the high pin count with the lands arranged at a fine pitch. The BGA semiconductor package is formed in such a manner that solder balls are mounted on the lands by reflow heating before the semiconductor package is attached on a printed wiring board (mother board), so that electrodes have a certain height.

The BGA semiconductor package is then attached to the printed wiring board on which solder is applied on the lands. Then, the reflow heating is again performed, so that the BGA semiconductor package is mounted on the printed wiring board.

The LGA semiconductor package is directly attached, in a state of the semiconductor package with no solder ball mounted thereon, to a printed wiring board with solder applied on the lands, and then is mounted on the printed wiring board by the reflow heating. As described above, the LGA semiconductor package has no solder ball mounted thereon, and thus advantageously achieves a less height of the printed circuit board. Furthermore, the LGA semiconductor package does not require reflow heating for mounting solder balls at the time of manufacturing a semiconductor package, and thus is advantageously used for a semiconductor device package with low thermal durability to reduce a number of heating processing at the time of manufacturing.

Due to the features described above, the LGA is frequently employed for an image sensor package on which image sensor elements are mounted, the image sensor element being the imaging semiconductor element in a mobile device and a digital camera required to be thin and having low thermal durability. Generally, the image sensor package is a hollow LGA semiconductor package formed by mounting an image sensor element on a package substrate molded in a cavity shape and sealing an imaging surface side with glass.

To reduce attaching of foreign objects to a light receiving unit of the image sensor element, in many cases, a base material of a substrate of the LGA package, used as the image sensor package, is a ceramic material featuring less dust emission compared with an organic substrate. The ceramic material further features high thermal conductivity and thus can advantageously prevent image quality degradation due to thermal noise by discharging heat produced when the image sensor element is operated for a long period of time for, for example, live view shooting and movie shooting.

However, the package substrate using the ceramic material is formed by baking, and thus warpage and undulation are likely to occur on the package substrate due to contraction in the baking. Thus, the flatness of the lands cannot be achieved in the LGA semiconductor package using the ceramic material for the package substrate.

Mounting of the LGA semiconductor package, with low flatness as described above, on the printed wiring board results in a state where some portions have a large distance and some portions have a small distance between the land of the package substrate and the land of the printed wiring board facing each other. When the reflow heating is performed in this state, the resultant molten solder is extended at the portion where the distance between the lands is large. The extended molten solder produces force of reducing a surface area due to the surface tension. That is, force of reducing the distance between the package substrate and the printed wiring board occurs. The solder at the portion where the distance between the lands is large is likely to be torn in the heating processing.

Furthermore, the force of reducing the distance between the package substrate and the printed wiring board is multiplied by the number of extended molten solder, so that the force becomes large as a whole. As a result, the molten solder, at the bonding portion with a small distance between the lands, is crushed by the sum of the force of reducing the distance between the package substrate and the printed wiring board produced by the extended molten solder and the load of the semiconductor package. As a result, the molten solder spreads out from the lands. Furthermore, the solder at such portion is easily flattened due to the small distance between the lands. The molten solder spreading outside of lands and coming into contact with the solder at the adjacent lands results in a solder bridging failure after the solder is solidified.

All things considered, the solder bridging failure is likely to occur when a warped or undulated semiconductor package is bonded to a printed wiring board. Japanese Patent Application Laid-Open No. 2005-11921 discloses a method of addressing this problem. More specifically, in the method, a larger printed amount of solder paste is provided to a bonding portion where a distance between a package land and a substrate land is large. With the amount of molten solder increased, force applied by the extended solder to reduce the distance between the package substrate and the printed wiring board is reduced. Thus, an attempt to prevent the solder bridging failure due to the flattened solder is facilitated.

Furthermore, in the method described in Japanese Patent Application Laid-Open No. 2005-11921, the printed amount of solder paste at the bonding portion with a large distance between the package substrate and the printed wiring board is large, and thus the solder is less likely to be torn.

To achieve higher sensitivity, a larger number of pixels, and improved moving image capturing function, high pin count and smaller pitch have also been increasingly required in the image sensor package, as in other semiconductor packages, such as an application integrated circuit (ASIC) or a memory. The lands on the ceramic substrate formed by baking have positions largely varied after the manufacturing. Thus, the ceramic substrate needs to be manufactured to have the land with a large area to prevent misalignment at the time of mounting to the printed wiring board. As a result, the distance between the adjacent lands on the package substrate is small. As described above, the LGA semiconductor package with no solder ball mounted thereon is generally used for the image sensor package.

To achieve the molten solder volume with which the force of reducing the distance between the package and the substrate applied by the extended solder as in the method described in Japanese Patent Application Laid-Open No. 2005-11921 at large lands with no solder ball, the solder paste with an extremely large volume needs to be supplied. When a large amount of solder paste is supplied to a portion where the distance between the adjacent lands is small, the solder pastes, at the adjacent lands, are likely to come into contact with each other due to slump of the solder paste by the mounting of parts or reflow heating, and thus the solder bridging failure is likely to occur.

At a portion where the distance between the lands is small, the solder with a large volume has a large diameter when it is molten and thus is likely to be in contact with the solder at the adjacent land thereby causing the risk of the solder bridging failure.

At the bonding portion where the diameter of the lands is large and the distance between the lands is short, to reduce the risk of the solder bridging failure due to causes other than the flattened solder, a solder supplied amount is preferably regulated to such a value that the height of the solder after the bonding becomes 30% or less of the land diameter. Thus, in the semiconductor package used for the image sensor package, it is difficult to supply a large amount of solder.

When the LGA semiconductor package is mounted on the printed wiring board, no solder ball is used, and thus the solder needs to be supplied only with the solder paste. Thus, the amount of flux supplied to the bonding portion is relatively larger in the LGA semiconductor package than in the BGA semiconductor package having solder balls. The solder paste is separated into solder and flux by being molten. If the flux stays in a recess of the solder resist, forming a land of the printed wiring board, might hinder the molten solder from spreading to the lands of the printed wiring board. As a result, an open solder joint failure is likely to occur in the LGA semiconductor package involving a large amount of flux, due to the flux staying in the recess of the solder resist.

SUMMARY OF THE INVENTION

Thus, the present invention is directed to reduction of the solder bridging failure and the open solder joint failure.

According to an aspect of the present invention, a printed circuit board includes a semiconductor package including a semiconductor element and a package substrate, and a printed wiring board on which the semiconductor package is mounted, wherein a plurality of first lands is formed apart from each other on a surface of the package substrate, wherein a plurality of second lands is formed apart from each other on a surface of the printed wiring board, wherein the surface of the package substrate and the surface of the printed wiring board face each other, and each of the plurality of the first lands and a corresponding one of the plurality of the second lands are bonded to each other with solder having a height of 30% or less of a diameter of a solder bonding portion at a respective one of the plurality of the first lands, and wherein a ratio of a solder bonded area of each of second lands, among the plurality of second lands, of which distance value to a corresponding one of the plurality of the first lands is larger than an average distance value between the plurality of first lands and the plurality of second lands, to a solder bonded area of the corresponding one of the first lands is 56% or more and 81% or less.

Further features of the present invention will become apparent from the following description of exemplary embodiments with reference to the attached drawings.

DESCRIPTION OF THE EMBODIMENTS

Exemplary embodiments of the present invention are described below with reference to the drawings.

Figure 1:
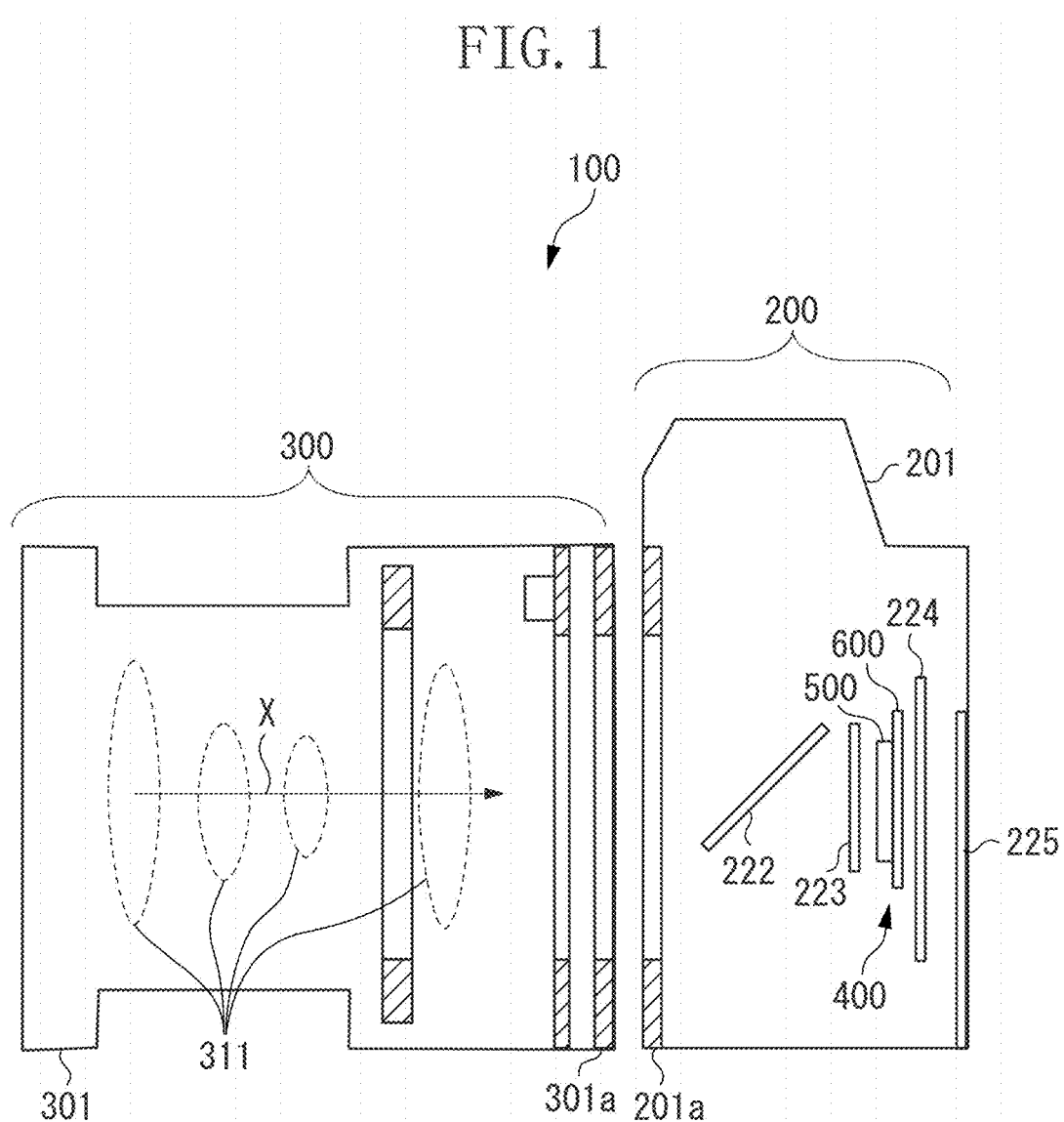
FIG. 1 is a diagram illustrating a schematic configuration of an image capturing apparatus as an example of electronic equipment according to a first exemplary embodiment.

FIG. 1 is a diagram illustrating a schematic configuration of an image capturing apparatus as an example of electronic equipment according to a first exemplary embodiment of the present invention. The image capturing apparatus as an example of the electronic equipment is a digital camera (camera) 100, that is, a digital single lens reflex camera for example, including a camera main body 200 and an interchangeable lens (lens barrel) 300 attachable to and detachable from the camera main body 200. In FIG. 1, the interchangeable lens 300 is attached to the camera main body 200. A case is described below in which the image capturing apparatus is formed by attaching the interchangeable lens 300 to the camera main body 200.

The camera main body 200 includes a casing 201, as well as a mirror 222, a shutter 223, an image sensor unit 400 as a printed circuit board, and an image processing circuit 224 that are disposed in the casing 201. The camera main body 200 includes a liquid crystal display 225 that is fixed to the casing 201 in such a manner that the liquid crystal display 225 is exposed to the outside from the casing 201. The image sensor unit 400 includes an image sensor package (semiconductor package) 500 and a printed wiring board (mother board) 600 on which the image sensor package 500 is mounted.

The interchangeable lens 300 includes a casing 301, as an interchangeable lens casing, and an imaging optical system 311. The imaging optical system 311 is disposed in the casing 301 and focuses an optical image on the image sensor package 500, when the casing 301 (interchangeable lens 300) is attached to the casing 201. The imaging optical system 311 includes a plurality of lenses.

The casing 301 includes a lens side mount 301a on which an opening is formed, and the casing 201 includes a camera side mount 201a on which an opening is formed. The interchangeable lens 300 (casing 301) is attached to the camera main body 200 (casing 201), when the lens side mount 301a and the camera side mount 201a are fit to each other. A direction indicated by an arrow X illustrated in FIG. 1 corresponds to an optical axis direction of the imaging optical system 311.

Light traveling in the direction indicated by the arrow X through the imaging optical system 311 is guided into the casing 201 through the opening of the lens side mount 301a in the casing 301 and the opening of the camera side mount 201a in the casing 201. In the casing 201, the mirror 222, the shutter 223, and the like are disposed along the direction indicated by the arrow X before the image sensor package 500.

Figure 2:
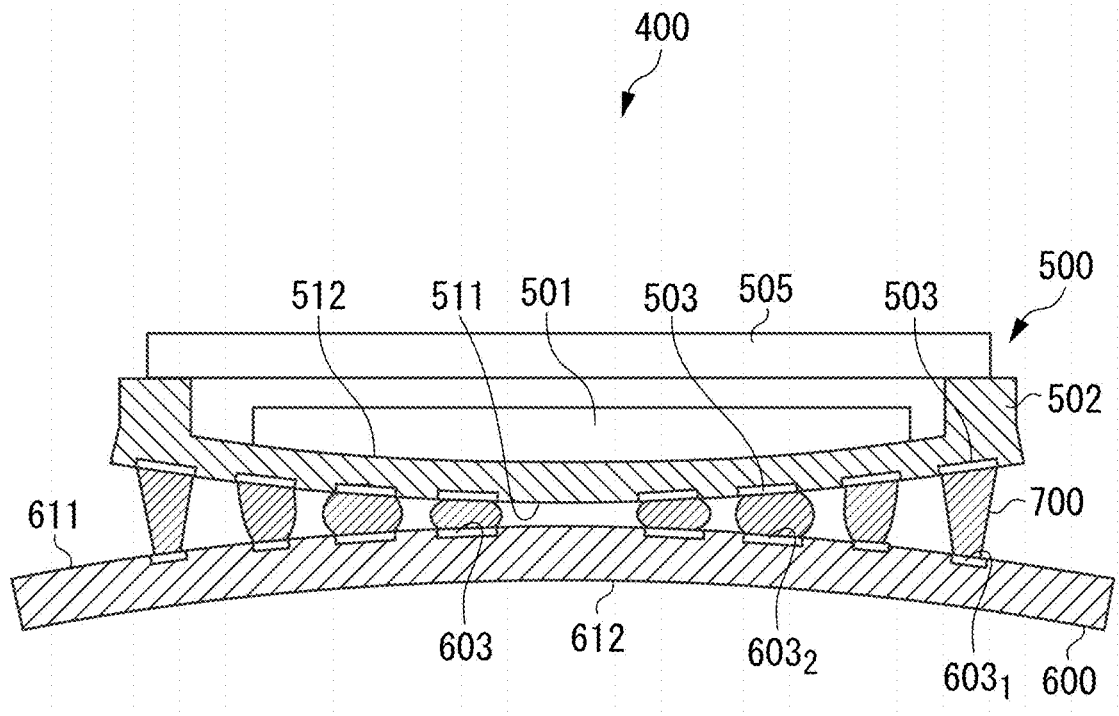
FIG. 2 is a cross-sectional view illustrating an image sensor unit as an example of a printed circuit board according to the first exemplary embodiment.

FIG. 2 is a cross-sectional view of the image sensor unit 400 as the printed circuit board according to the first exemplary embodiment of the present invention.

The image sensor package 500 as a semiconductor package is an LGA semiconductor package. The image sensor package 500 includes an image sensor element 501 as a semiconductor element and a ceramic substrate 502 as a package substrate on which the image sensor element 501 is mounted.

The image sensor element 501 is a solid state imaging element, such as a complementary metal oxide semiconductor (CMOS) image sensor, a charge-coupled device (CCD) image sensor, or the like that performs photoelectrical conversion on the focused optical image.

The ceramic substrate 502 includes a pair of surfaces 511 and 512. On the surface 511, a plurality of lands (first lands, package side lands) 503 each made of a conductor is formed on an insulator substrate. The image sensor element 501 is mounted on the surface 512. On the surface 512, a glass plate 505 is disposed without being in contact with the image sensor element 501. The image sensor element 501 is disposed in a hollow portion defined by the glass plate 505 and the surface 512.

The plurality of the lands 503 is disposed apart from each other on the surface 511. In the first exemplary embodiment, the plurality of the lands 503 is arranged at an equal interval in a grid pattern (array pattern), that is, a square lattice pattern. A base material of the insulator forming the ceramic substrate 502 is ceramic.

The printed wiring board 600 includes a pair of surfaces 611 and 612. On the surface 611, a plurality of lands (second lands, substrate side lands) 603 each made of a conductor is formed on an insulator substrate. The plurality of lands 603 is disposed apart from each other on the surface 611. In the first exemplary embodiment, the plurality of the lands 603 is arranged at an equal interval, which is the same interval as the interval of the lands 503, in a grid pattern (array pattern), that is, a square lattice pattern. A base material of the insulator forming the printed wiring board 600 is glass epoxy.

The surface 511 of the ceramic substrate 502 and the surface 611 of the printed wiring board 600 face each other. The lands 503 are bonded to the corresponding lands 603 by solder 700.

Figure 3:
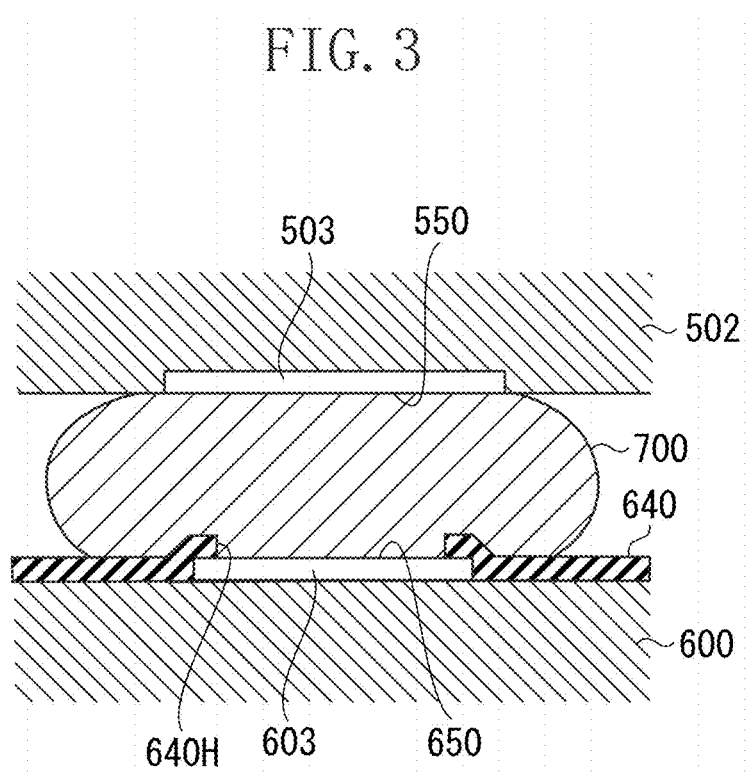
FIG. 3 is a cross-sectional view illustrating a solder bonding portion of a first land of a package substrate in the image sensor unit as an example of a printed circuit board and a solder bonding portion of a second land of the printed wiring board, according to the first exemplary embodiment.

FIG. 3 is a cross-sectional view illustrating a solder bonding portion 650 of one of the lands 603 of the printed wiring board 600 and a solder bonding portion 550 of one of the lands 503 of the ceramic substrate 502, in the image sensor unit 400 as the printed circuit board.

In the first exemplary embodiment, the image sensor package 500 is the LGA semiconductor package. Therefore, the height of the solder 700 is less than the height of the corresponding solder in a BGA semiconductor package and is 30% or less of the diameter of the solder bonding portion 550 of the land 503.

On the surface 611 of the printed wiring board 600, a solder resist 640 is formed. The solder bonding portion 650 of each land 603 is exposed through an opening 640H formed on the solder resist 640. The solder bonding portion 650 is a portion that comes into contact with the solder 700. The solder bonding portion 650 may be formed entirely or partially on the surface of the land 603. In the first exemplary embodiment, the solder bonding portion 650 is formed partially on the surface of the land 603. When no solder resist is formed on the surface 611, the solder bonding portion 650 is formed entirely on the surface of the land 603.

No solder resist is formed on the surface 511 of the ceramic substrate 502, and thus the solder bonding portion 550 is formed entirely on the surface of the land 503. The solder bonding portion 550 is a portion that comes into contact with the solder 700. An unillustrated solder resist may be formed on the surface 511 of the ceramic substrate 502. In such a case, the solder bonding portion 550 of each land 503 may be exposed through an opening formed on the unillustrated solder resist. In such a case, the solder bonding portion 550 may be formed entirely or partially on the surface of the land 503.

In the first exemplary embodiment, an area (solder bonded area) of the solder bonding portion 550 depends on the size of the land 503. An area (solder bonded area) of the solder bonding portion 650 depends on the size of the land 603 and the size of the opening 640H of the solder resist 640. Thus, the area (solder bonded area) of the solder bonding portion 550 can be set by adjusting the size of the land 503, and the area (solder bonded area) of the solder bonding portion 650 can be set by adjusting the size of the opening 640H (and the land 603).

In the first exemplary embodiment, the solder bonding portion 550 of the land 503 and the solder bonding portion 650 of the land 603 are bonded to each other by the solder 700. The solder bonding portions 550 of the plurality of lands 503 are set to have the same size of area.

In FIG. 2, a land $603_1$ has a distance to the land 503 that is larger than an average value of the distances between lands 503 and the lands 603. In the first exemplary embodiment, at least a ratio of an area of the solder bonding portion 650 of the land $603_1$ to the area of the solder bonding portion 550 of the land 503 is 56% or more and 81% or less. The area of the solder bonding portion 650 of the land $603_1$ is the solder bonded area of the land $603_1$. The area of the solder bonding portion 550 of the land 503 is the solder bonded area of the land 503. The solder bonded area of a land 6032, which is one of the lands 603 other than the land $603_1$, is the same as the solder bonded area of the land 503. In the first exemplary embodiment, the size of the solder bonded area is the same between the lands $603_1$, and is also the same between the lands 6032.

In the first exemplary embodiment described above, the ratio of the solder bonded area of the land $603_1$ to the solder bonded area of the land 503 is set to 81% or less. Thus, force of reducing the distance between the ceramic substrate 502 and the printed wiring board 600 when the solder is molten, can be reduced. The ratio of the solder bonded area of the land $603_1$ to the solder bonded area of the land 503 is set to 56% or more. Thus, the contact area between the solder resist and the molten solder is regulated, whereby discharging of flux separated from the molten solder from a portion above the land $603_1$ can be facilitated. The open solder joint failure can be thus reduced.

In the case described above, the solder bonded area is the same size between the lands $603_1$. Alternatively, the solder bonded area may not be the same between the lands $603_1$ as long as the ratio of 56% or more and 81% or less is achieved.

Figure 4:
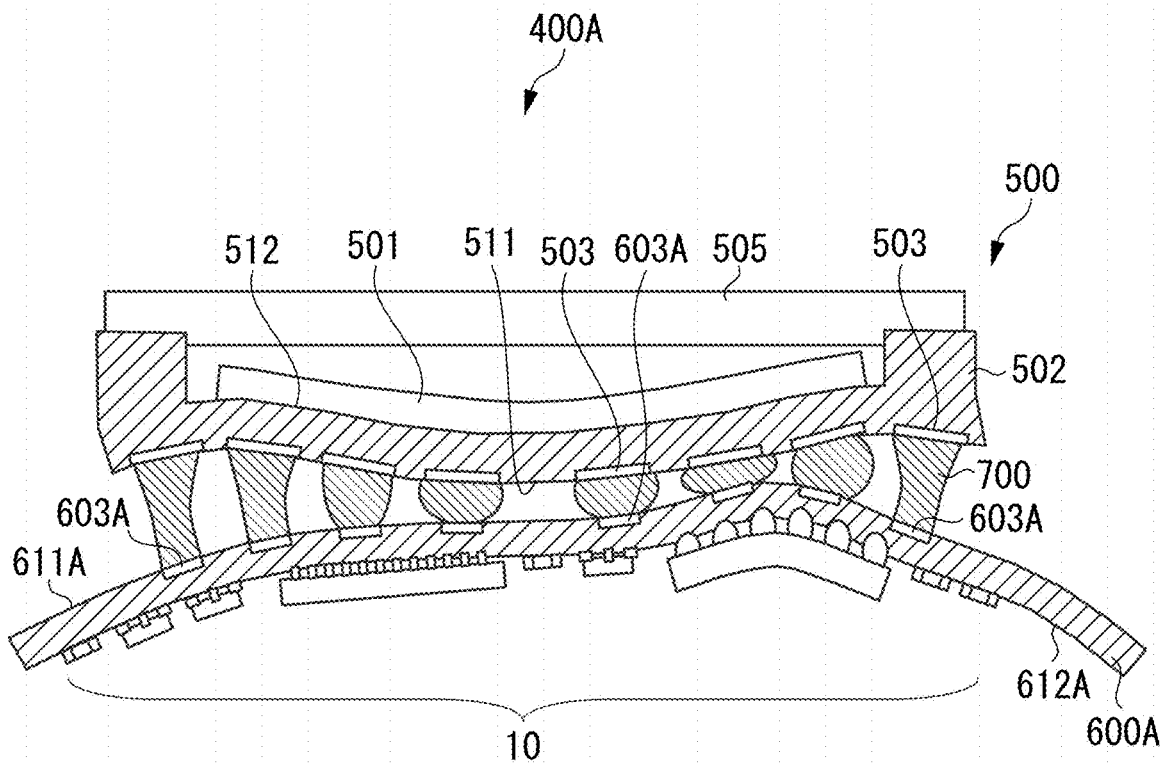
FIG. 4 is a cross-sectional view illustrating an image sensor unit as an example of a printed circuit board according to a second exemplary embodiment.

A printed circuit board according to a second exemplary embodiment of the present invention is described. FIG. 4 is a cross-sectional view of an image sensor unit as an example of the printed circuit board according to the second exemplary embodiment of the present invention. Configurations that are the same as those in the first exemplary embodiment are denoted with the same reference numerals, and will not be described.

When undulated shapes of the image sensor package 500 and the printed wiring board 600A differ among samples, it is difficult to recognize all the distances between the land 503 and the land 603 of all the combination therebetween, before the bonding.

As illustrated in FIG. 4, an image sensor unit 400A, as a printed circuit board, includes the image sensor package 500 and a printed wiring board 600A. The image sensor package 500 has a configuration that is the same as that in the first exemplary embodiment. The printed wiring board 600A has a configuration that is different from that of the printed wiring board 600 in the first exemplary embodiment.

The image sensor package 500 is an LGA semiconductor package as in the first exemplary embodiment. As in the first exemplary embodiment, the image sensor package 500 includes the image sensor element 501 as a semiconductor element and the ceramic substrate 502 as a package substrate on which the image sensor element 501 is mounted. The ceramic substrate 502 includes the pair of surfaces 511 and 512. On the surface 511, the plurality of lands (first lands, package side lands) 503 is formed. The image sensor element 501 is mounted on the surface 512. A base material of the insulator forming the ceramic substrate 502 is ceramic.

The printed wiring board 600A includes a pair of surfaces 611A and 612A. On the surface 611A, a plurality of lands (second lands, substrate side lands) 603A each made of a conductor is formed on an insulator base material. The plurality of lands 603A is disposed apart from each other on the surface 611. In the second exemplary embodiment, the lands 603A are arranged at an equal interval that is the same as the interval of the lands 503 in a grid pattern (array pattern), that is, a square lattice pattern. A base material of the insulator forming the printed wiring board 600A is glass epoxy. A plurality of electronic components 10, such as a connector and a chip part, is mounted on the surface 612A of the printed wiring board 600A on the side opposite to the surface 611A on which the image sensor package 500 is mounted.

The surface 511 of the ceramic substrate 502 and the surface 611A of the printed wiring board 600A face each other. The lands 503 are bonded to the corresponding lands 603A by the solder 700.

The ceramic substrates 502 have different undulated shapes as a result of baking, and thus the image sensor packages 500, including the ceramic substrates 502, also have different undulated shapes. The image sensor package 500 has a large area, and thus the printed wiring board 600A on which the image sensor package 500 is mounted also has a large area. Furthermore, because a large number of the electronic components 10 is mounted on the surface 612A opposite to the surface 611A on which the image sensor package 500 is mounted, the printed wiring board 600A has an inconstant undulated shape. To attach the image sensor package 500 and the printed wiring board 600A to each other, the ceramic substrate 502 and the printed wiring board 600A, having different undulated shapes, need to be bonded by the solder 700. Thus, a pattern of bonding portions with long and short distances between the lands 503 on the package side and the lands 603A on the substrate side differs among samples. Thus, it is difficult to recognize a portion where a large amount of solder needs to be supplied as a target, which is generally practiced technique.

In the second exemplary embodiment, the image sensor package 500 is the LGA semiconductor package. Therefore the image sensor package 500 has the height of the solder 700 that is less than that the height of the corresponding solder in a BGA semiconductor package and is 30% or less of the diameter of the solder bonding portion 550 of the land 503. The solder bonding portions of the land 503 and the land 603A are the same as those in the first exemplary embodiment.

An area of the solder bonding portion (solder bonded area) is set to be the same size among all of the plurality of lands 503.

In the second exemplary embodiment, a ratio of the solder bonded area of each of the lands 603A to the solder bonded area of the land 503 is set to be 56% or more and 81% or less.

According to the second exemplary embodiment, the ratio of the solder bonded area of the land 603A to the solder bonded area of the land 503 is set to 81% or less. Thus, smaller force of reducing the distance between the ceramic substrate 502 and the printed wiring board 600A when the solder is molten can be achieved. The ratio of the solder bonded area of the land 603A to the solder bonded area of the land 503 is set to 56% or more. Thus, the contact area between the solder resist and the molten solder is regulated, whereby discharging of flux separated from the molten solder from a portion above the land 603A can be facilitated. The open solder joint failure can be thus reduced.

In the description above, the solder bonded area is set to be the same size among the lands 603A. Alternatively, the solder bonded area may be different among the lands 603A as long as the ratio of the solder bonded area to the solder bonded area of the land 503 is 56% or more and 81% or less.

Figure 5A:
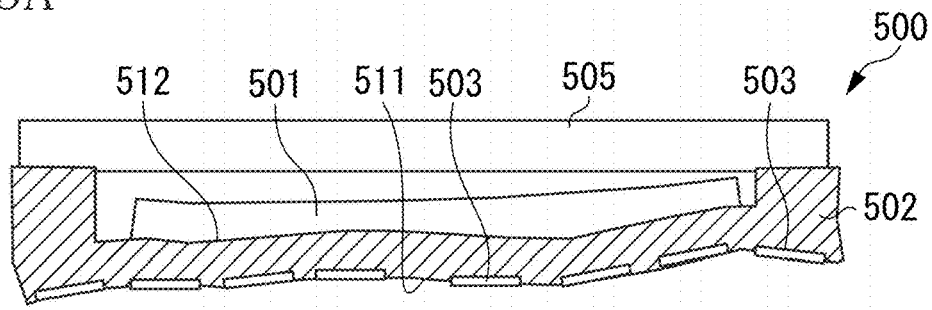
FIG. 5A is a cross-sectional view illustrating a sample of image sensor packages created as Example.
Figure 5B:
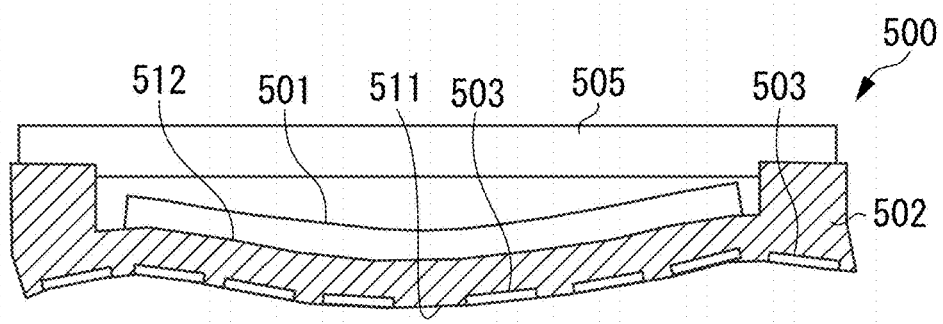
FIG. 5B is a cross-sectional view illustrating another sample of the image sensor packages created as Example.
Figure 5C:
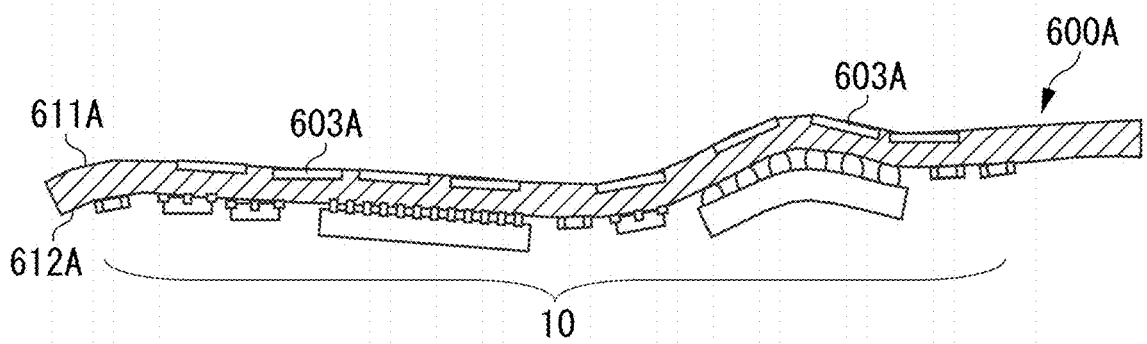
FIG. 5C is a cross-sectional view illustrating a sample of printed wiring boards on which electronic components are mounted, created as Example.
Figure 5D:
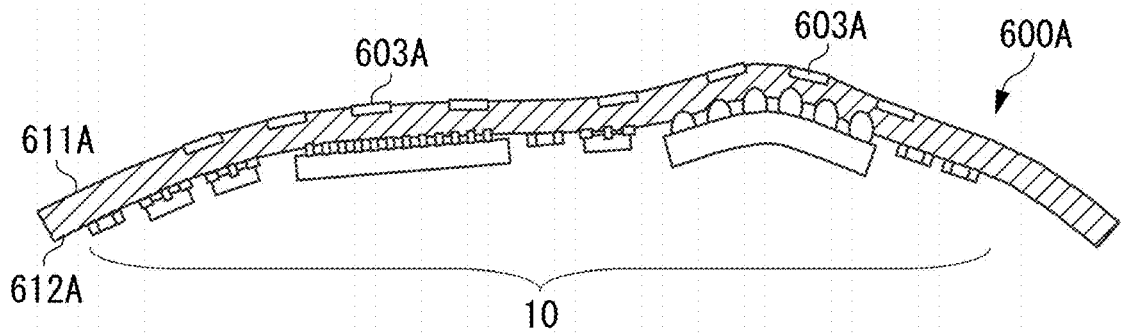
FIG. 5D is a cross-sectional view illustrating another sample of the printed wiring boards on which the electronic components are mounted, created as Example.

Example (experiment result) corresponding to the exemplary embodiment described above (second exemplary embodiment) is described below. FIG. 5A is a cross-sectional view of one of samples of the image sensor package 500 created as Example. FIG. 5B is a cross-sectional view of another one of the samples of the image sensor package 500 created as Example. FIG. 5C is a cross-sectional view of one of samples of the printed wiring board 600A and the electronic components 10 created as Example mounted thereon. FIG. 5D is a cross-sectional view of another one of the samples of the printed wiring board 600A and the electronic components 10 created as Example mounted thereon.

The image sensor package 500 is a hollow structure package including the ceramic substrate 502 with an outer size of 34.0 mm×28.4 mm and the image sensor element 501 mounted thereon. The lands 503 of the image sensor package 500, each having a diameter size of 1.0 mm, are arranged at a pitch of 1.5 mm in a grid form.

The coplanarity of the lands 503 at the melting temperature of the solder 700 was measured for a plurality of samples with digital image correlation. The result of coplanarity measurement on the lands 503 indicates that the coplanarity was 20 μm in a sample with the smallest value and was 25 μm in a sample with the largest value. As illustrated in FIGS. 5A and 5B, the undulated shapes of the ceramic substrates 502 were different between the samples. The fluctuations in the undulated shape of the ceramic substrates 502 and the coplanarity of the lands 503 are mainly caused when the ceramic substrates 502 are being baked.

The differences in the image sensor elements 501 and in the glass plates 505 lead to larger fluctuations in the undulated shape of the ceramic substrates 502 with the image sensor elements 501 and the glass plates 505 mounted thereon and in the coplanarity of the lands 503.

The printed wiring board 600A has an outer size of about 50.0 mm×50.0 mm, and is made of a glass epoxy material. The lands 603A on the printed wiring board 600A are disposed at positions facing the lands 503. The thickness of the solder resist (not illustrated) for opening of the lands 603A is about 25 μm.

A plurality of electronic components 10, such as a connector and a chip part is mounted on the surface 612A of the printed wiring board 600A opposite to the surface 611A on which the image sensor package 500 is mounted. The coplanarity of the lands 603A at the melting temperature of the solder 700, with the electronic components 10 mounted, was measured with digital correlation for a plurality of samples as in the case of the lands 503.

The result of measuring the coplanarity of the lands 603A indicates that the coplanarity was 25 μm in a sample with the smallest value and was 60 μm in a sample with the largest value. As illustrated in FIGS. 5C and 5D, the undulated shapes of the printed wiring board 600A were different between the samples.

The fluctuations in the coplanarity of the lands 603A and the undulated shape of the printed wiring board 600A, mainly caused when the printed wiring board 600A is being molded, increase as a result of the process of mounting the electronic components 10. The image sensor package 500 and the printed wiring board 600A are bonded to each other with the solder 700 having a volume of 0.118 mm³±20%.

In order to examine the relationship between the bonding area of the lands 603A (opening area) and the occurrence of the mounting failure, the ratio (S2/S1) of a bonding area S2 of the land 603A to a bonding area S1 of the land 503 was changed within a range of 49% to 100%.

The size of the land 603A was changed at all the portions to be bonded to the corresponding land 503, regardless of the undulated shape of the printed wiring board 600A.

The height of the solder 700 after the bonding was within a range of about 0.12 μm to 0.25 μm, which was a height of 30% or less of the diameter of the solder bonding portion of the land 503 on the image sensor package 500. The relationship between the above-described ratio of areas and rates of occurrence of failures after the mounting is listed in the following table.

| Ratio of area of substrate land to package land (%) | Rate of occurrence of bridging failure (%) | Rate of occurrence of open solder joint failure (%) |
| --- | --- | --- |
| 100 | 12.5 | 0.0 |
| 81 | 0.0 | 0.0 |
| 64 | 0.0 | 0.0 |
| 56 | 0.0 | 0.0 |
| 49 | 0.0 | 50.0 |

In the table above, the package land is the land 503, and the substrate land is the land 603A. The ratio of area is S2/S1 where the area of the solder bonding portion of the land 503 is S1 and the area of the solder bonding portion of the land 603A is S2.

Figure 6A:
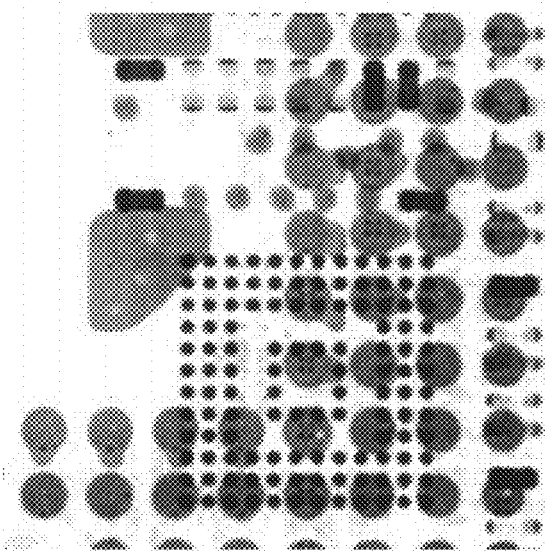
FIG. 6A is a diagram illustrating an X-ray photograph of an image sensor unit as a comparative example where a ratio of a solder bonded area of a land on a side of a printed wiring board to a solder bonded area of a land on a side of a package substrate is set to 100%.
Figure 6B:
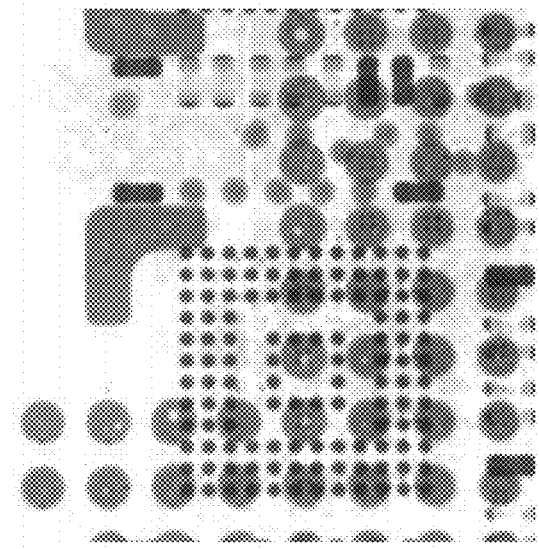
FIG. 6B is a diagram illustrating an X-ray photograph of an image sensor unit corresponding to the exemplary embodiment where the ratio of a solder bonded area of a land on the side of a printed wiring board to a solder bonded area of a land on the side of a package substrate is set to 81%.

FIG. 6A is a diagram illustrating an X-ray photograph of an image sensor unit as Comparative Example. In this Comparative Example, the solder bonded area of the land on a side of the printed wiring board is the same as the solder bonded area of the land on a side of the package substrate, that is, the ratio of area was set to 100%. FIG. 6B is a diagram illustrating an X-ray photograph of the image sensor unit 400A as Example. In this Example, the ratio of the solder bonded area of the land 603A to the solder bonded area of the land 503 was set to 81%.

The solder bridging failure as illustrated in FIG. 6A occurred at a rate of 12.5% when the solder bonded area of the land 603A was the same as the solder bonded area of the land 503, that is, with a ratio of area of 100%.

By contrast, as illustrated in the table, in Example where the ratio of the solder bonded area of the land 603A to the solder bonded area of the land 503 was set to 81%, no solder bridging failure occurred as illustrated in FIG. 6B.

As described above, no solder bridging failure occurs when the ratio of the solder bonded area of the land 603A to the solder bonded area of the land 503 is 81% or less. More specifically, the force, reducing the distance between the ceramic substrate 502 and the printed wiring board 600A, produced when the solder 700 is molten, is reduced at a portion where the distance between the land 503 and the land 603A is large. Therefore, the solder bridging failure can be prevented.

To obtain a higher effect, the ratio of the solder bonded area of the land 603 to the solder bonded area of the land 503 may be set to 81% or less only at a portion where the solder 700 extends at the time of the melting.

More specifically, the solder bridging failure can be prevented by setting the ratio of the solder bonded area of the land 603 to the solder bonded area of the land 503 to be 81% or less at a bonding portion with a distance larger than an average value of the distances between the lands 503 and 603 at all the bonding portions after the bonding.

As described in the exemplary embodiment, the undulated shapes of the image sensor package 500 and the printed wiring board 600A might be different among samples. Therefore, it is difficult to recognize all the distances between the lands 503 and 603A in all the combinations before the bonding. In such a case, the ratio of the solder bonded area of each land 603A to the solder bonded area of the corresponding land 503 may be set to 81% or less at all the portions where the lands 603A and the lands 503 are bonded as illustrated in FIG. 2. Thus, the solder bridging failure can be prevented regardless of the undulated shapes of the image sensor package 500 and the printed wiring board 600A.

Figure 7:
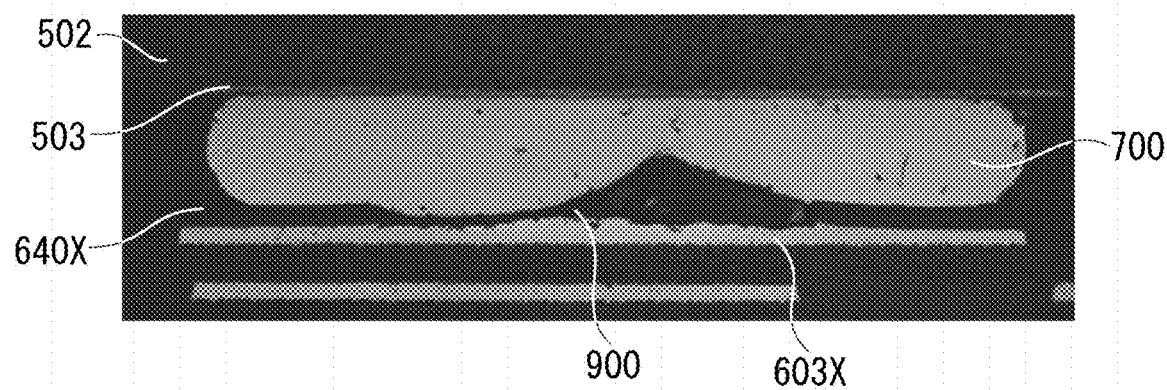
FIG. 7 is a diagram illustrating a photograph of a cross section of an image sensor unit as a comparative example where the ratio of a solder bonded area of a land on the side of a printed wiring board to a solder bonded area of a land on the side of a package substrate is set to 49%.
Figure 8:
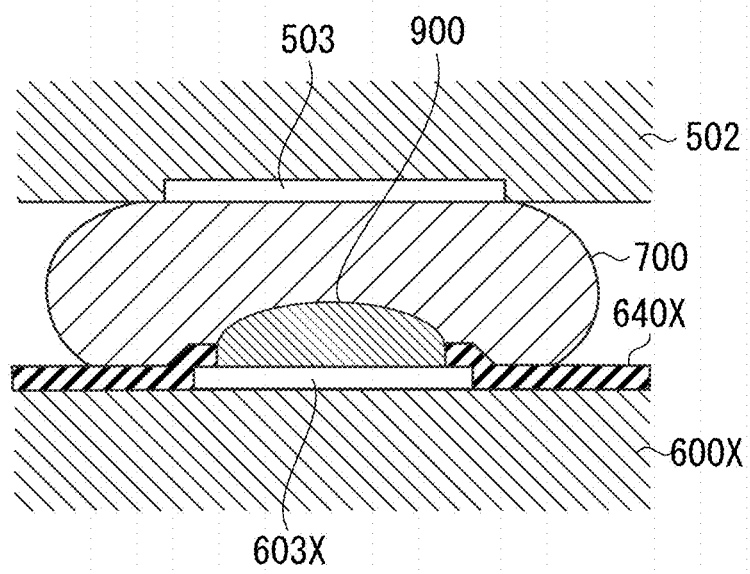
FIG. 8 is a schematic cross-sectional view illustrating the image sensor unit as the comparative example where the ratio of the solder bonded area of the land on the side of the printed wiring board to the solder bonded area of the land on the side of the package substrate is set to 49%.

When the ratio of the solder bonded area of the land 603A to the solder bonded area of the land 503 was set to 49%, the open solder joint failure occurs at a rate of 50%. FIG. 7 is a diagram illustrating a photograph of a cross-section of the image sensor unit as Comparative Example where the ratio of the solder bonded area of a land 603X to the solder bonded area of the land 503 was set to 49%. FIG. 8 is a schematic cross-sectional view of the image sensor unit as Comparative Example where the ratio of the solder bonded area of a land 603X to the solder bonded area of the land 503 was set to 49%. In the cross section causing the open solder joint failure as illustrated in FIGS. 7 and 8, a flux 900 stays in a space defined by the land 603X, the solder 700, and a solder resist 640X to hinder the spreading of the solder 700 to the land 603X.

In a case where the ratio of the solder bonded area of the land 603X to the solder bonded area of the land 503 is 49%, The discharging of the flux 900 is hindered because an area where the molten solder 700 comes into contact with the solder resist 640X is large.

The open solder joint failure can be prevented by setting the ratio of the solder bonded area of the land 603A to the solder bonded area of the land 503 to 56% or more.

As described above, in the first exemplary embodiment, the ratio of the solder bonded area of the land $603_1$ to the solder bonded area of the land 503 is set to 81% or less when the ceramic substrate 502 and the printed wiring board 600 that are warped are bonded to each other. Thus, the force of reducing the distance between the ceramic substrate 502 and the printed wiring board 600 at the time of melting the solder can be reduced. As a result, the force of pressing and flattening the molten solder at the bonding portion where the distance between the land 503 and the land 603 is small is reduced, whereby the solder bridging failure due to the flattened solder can be prevented.

By setting the ratio of the solder bonded area of the land $603_1$ to the solder bonded area of the land 503 to 56% or more, the contact area between the solder resist 640 and the molten solder is regulated. As a result, discharging of the flux separated from the molten solder 700 from a portion above the land $603_1$ can be facilitated, whereby the open solder joint failure can be thus reduced.

In the second exemplary embodiment, the ratio of the solder bonded area of each land 603A to the solder bonded area of the corresponding land 503 is set to 81% or less. Thus, even when the ceramic substrate 502 and the printed wiring board 600A have different undulated shapes from each other and the distance between the lands 503 and 603A cannot be recognized in advance, the force of reducing the distance between the ceramic substrate 502 and the printed wiring board 600A when the solder is molten can be reduced. As a result, the force of pressing and flattening the molten solder at the bonding portion where the distance between the lands 503 and 603A is small is further reduced even when the ceramic substrate 502 and the printed wiring board 600A are undulated. Thus, the solder bridging failure due to the flattened solder can be more effectively reduced. When the ratio of the solder bonded area of the land 603A on the substrate side to the solder bonded area of the land 503 on the package side is set to 56% or more, the open solder joint failure can be reduced even when the ceramic substrate 502 and the printed wiring board 600A are undulated.

In a case where an package substrate is the ceramic substrate 502, the present invention is also effective for the semiconductor package that needs the lands having an even larger size because the ceramic substrates 502 differ in the undulated shape. When a large number of electronic components 10 is mounted on the printed wiring board 600A, the printed wiring boards 600A differ from each other in the undulated shape. Thus, the present invention is effective when the semiconductor package is mounted on the printed wiring board. The present invention is also effective when the image sensor package has a hollow structure and a large size and involves a large difference in the undulated shapes.

The present invention is not limited to the exemplary embodiments described above, and can be modified in various ways within the technical concept of the present invention.

In the exemplary embodiments described above, the image capturing apparatus is formed by attaching the interchangeable lens 300 to the camera main body 200. However, this should not be construed in a limiting sense. The camera main body 200 on which no interchangeable lens 300 is attached alone serves as an image capturing apparatus. In the above description, the camera 100 is divided into the camera main body 200 and the interchangeable lens 300. Alternatively, the present invention can be applied to an integrated camera in which the camera main body 200 incorporates a lens. The image capturing apparatus, which is the camera in the description above, may be a mobile device including a printed circuit board with an image sensor package.

In the description above, the semiconductor element is the image sensor element, that is, the semiconductor package is the image sensor package. However, this should not be construed in a limiting sense, and the present invention may be applied to a different semiconductor package, such as a memory or a memory controller. Here, the electronic equipment on which the printed circuit board is mounted is not limited to the image capturing apparatus, and the printed circuit board can be mounted on any electronic equipment.

In the exemplary embodiments described above, the package substrate is the ceramic substrate 502. However, this should not be construed in a limiting sense. The package substrate may be made of a glass epoxy material as in the case of the printed wiring board. Similarly, the printed wiring boards 600 and 600A, made of a glass epoxy material in the description above, may be formed of a ceramic substrate as in the case of the package substrate.

With the present invention, the solder bridging failure and the open solder joint failure are reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A printed circuit board comprising:
   a semiconductor package including a ceramic substrate on which a semiconductor element is mounted and having a first surface on which a plurality of first lands is arranged;
   a plurality of electronic components, the plurality of electronic components including a connector and a chip part; and
   a printed wiring board having a second surface and a third surface on a side different from the second surface, the second surface facing the first surface and on which a plurality of second lands respectively corresponding to the plurality of first lands is arranged, the plurality of electronic components being mounted on the third surface; wherein the plurality of first lands is respectively bonded to the plurality of second lands by solder,
   wherein a ratio of a first bonding area of at least one of the second lands to a second bonding area in which a corresponding one of the first lands is bonded to the solder is 56% or more and 81% or less of,
   wherein an area where the plurality of electronic components is mounted on the third surface is wider than the first surface of the semiconductor package.

2. The printed circuit board according to claim 1, wherein the ceramic substrate has an undulated shape, and wherein the printed wiring board has an undulated shape.

3. The printed circuit board according to claim 1, wherein the plurality of first lands is arranged on the first surface in a grid pattern, and
   wherein the plurality of second lands is arranged on the second surface in a grid pattern.

4. The printed circuit board according to claim 1, wherein the printed wiring board includes, on a surface, a solder resist layer including a plurality of openings corresponding to the plurality of second lands, and
   wherein the first bonding area in which the second lands are bonded to the solder is defined by the openings.

5. The printed circuit board according to claim 1, wherein the second bonding area in which the first lands are bonded to the solder is defined by an area of the first lands.

6. The printed circuit board according to claim 1, wherein the semiconductor package includes, on the first surface, a solder resist layer including a plurality of openings corresponding to the plurality of first lands, and
   wherein an the second bonding area in which the first lands are bonded to the solder is defined by an area of the openings of the solder resist layer.

7. The printed circuit board according to claim 1, wherein the semiconductor element is an image sensor element.

8. The printed circuit board according to claim 1, wherein the semiconductor package is a Land Grid Array (LGA) semiconductor package.

9. The printed circuit board according to claim 1, wherein a height of the solder is 30% or less of a diameter of the area in which the first lands are bonded to the solder.

10. The printed circuit board according to claim 1, wherein the at least one of the second lands bonded to the solder in the area of 56% or more and 81% or less of the area in which the corresponding one of the first lands is bonded to the solder is arranged in a region where an interval between the corresponding one of the first lands and the at least one of the second lands bonded to the corresponding one of the first lands is larger than an average value of intervals between the plurality of first lands and the plurality of second lands respectively bonded to the plurality of first lands.

11. An electronic equipment comprising:
    printed circuit board; and
    a casing configured to contain the printed circuit board,
    wherein the printed circuit board comprises, a semiconductor package including a ceramic substrate on which a semiconductor element is mounted and having a first surface on which a plurality of first lands is arranged;
    a plurality of electronic components, the plurality of electronic components including a connector and a chip part; and
    a printed wiring board having a second surface and a third surface on a side different from the second surface, the second surface facing the first surface and on which a plurality of second lands respectively corresponding to the plurality of first lands is arranged, the plurality of electronic components being mounted on the third surface;
    wherein the plurality of first lands is respectively bonded to the plurality of second lands by solder,
    wherein a ratio of a first bonding area of at least one of the second lands to a second bonding area in which a corresponding one of the first lands is bonded to the solder is 56% or more and 81% or less,
    wherein an area where the plurality of electronic components is mounted on the third surface is wider than the first surface of the semiconductor package.

12. The electronic equipment according to claim 11, wherein the semiconductor element is an image sensor element, and
    wherein an image processing circuit is contained in the casing.

13. The electronic equipment according to claim 12 wherein the semiconductor element is camera.

14. The printed circuit board according to claim 1, wherein, in a side view of the printed circuit board, at least one of the connector and the chip part is provided just under the solder.

15. A printed circuit board comprising:
    a semiconductor package including a ceramic substrate on which a semiconductor element is mounted and having a first surface on which a plurality of first lands is arranged;
    a plurality of electronic components; and
    a printed wiring board having a second surface and a third surface on a side different from the second surface, the second surface facing the first surface and on which a plurality of second lands respectively corresponding to the plurality of first lands is arranged, the plurality of electronic components being mounted on the third surface;
    wherein the plurality of first lands is respectively bonded to the plurality of second lands by solder,
    wherein a ratio of a first bonding area of at least one of the second lands to a second bonding area in which a corresponding one of the first lands is bonded to the solder is 56% or more and 81% or less of, wherein the plurality of electronic components include a connector and a chip part, wherein, in a side view of the printed circuit board, at least one of the connector and the chip part is provided just under the solder.

16. An electronic equipment comprising:

printed circuit board; and a casing configured to contain the printed circuit board, wherein the printed circuit board comprises, a semiconductor package including a ceramic substrate on which a semiconductor element is mounted and having a first surface on which a plurality of first lands is arranged;

a plurality of electronic components; and a printed wiring board having a second surface and a third surface on a side different from the second surface, the second surface facing the first surface and on which a plurality of second lands respectively corresponding to the plurality of first lands is arranged, the plurality of electronic components being mounted on the third surface;

wherein the plurality of first lands is respectively bonded to the plurality of second lands by solder, wherein a ratio of a first bonding area of at least one of the second lands to a second bonding area in which a corresponding one of the first lands is bonded to the solder is 56% or more and 81% or less, wherein the plurality of electronic components include a connector and a chip part, wherein, in a side view of the printed circuit board, at least one of the connector and the chip part is provided just under the solder.

* * * * *